US010177855B2

(12) United States Patent
Sato et al.

(10) Patent No.: US 10,177,855 B2
(45) Date of Patent: Jan. 8, 2019

(54) AMPLITUDE ADJUSTMENT CIRCUIT, DIGITAL COHERENT RECEIVER, AND AMPLITUDE ADJUSTMENT METHOD

(71) Applicant: FUJITSU LIMITED, Kawasaki-shi, Kanagawa (JP)

(72) Inventors: Masashi Sato, Kawasaki (JP); Kazuhiko Hatae, Kawasaki (JP); Nobukazu Koizumi, Kawasaki (JP); Yasuo Ohtomo, Yokohama (JP); Masato Oota, Atsugi (JP); Daisuke Sasaki, Yokohama (JP); Yuya Imoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/726,428

(22) Filed: Oct. 6, 2017

(65) Prior Publication Data

US 2018/0123701 A1 May 3, 2018

(30) Foreign Application Priority Data

Oct. 31, 2016 (JP) .................................. 2016-212660

(51) Int. Cl.
*H04B 10/60* (2013.01)
*H04B 10/61* (2013.01)
(Continued)

(52) U.S. Cl.
CPC ........... *H04B 10/6165* (2013.01); *H03K 7/02* (2013.01); *H04B 10/2569* (2013.01);
(Continued)

(58) Field of Classification Search
CPC .... H04B 10/61; H04B 10/614; H04B 10/616; H04B 10/6151; H04B 10/6165;
(Continued)

(56) References Cited

U.S. PATENT DOCUMENTS 7,239,673 B2* 7/2007 Sawada .............. G11B 20/1833
375/316
2004/0083069 A1* 4/2004 Wu ........................ G01R 23/16
702/77
(Continued)

FOREIGN PATENT DOCUMENTS

JP 8-317012 11/1996
JP 2012-114599 6/2012

*Primary Examiner* — Siu Lee
(74) *Attorney, Agent, or Firm* — Fujitsu Patent Center

(57) ABSTRACT

An amplitude adjustment circuit includes a memory that stores correspondence information between frequency distributions of an amplitude and adjustment coefficients, a processor configured to generate a frequency distribution of amplitude of data for which adaptive equalization processing has been executed, acquire the correspondence information between frequency distributions of the amplitude and adjustment coefficients from the memory, select the adjustment coefficient based on a result of comparison between the frequency distributions included in the correspondence information acquired by the acquiring unit and the frequency distribution generated by the generating unit, and adjust a gain of the data based on the adjustment coefficient selected by the selecting unit.

10 Claims, 17 Drawing Sheets

(51) Int. Cl.
　　　*H03K 7/02* 　　　(2006.01)
　　　*H04B 10/2569* 　(2013.01)
　　　*H04J 14/06* 　　(2006.01)
　　　*H04L 1/00* 　　　(2006.01)
　　　*H04L 25/03* 　　(2006.01)

(52) U.S. Cl.
　　　CPC ......... *H04B 10/612* (2013.01); *H04B 10/614* (2013.01); *H04B 10/616* (2013.01); *H04B 10/6151* (2013.01); *H04J 14/06* (2013.01); *H04L 1/0039* (2013.01); *H04L 25/03* (2013.01)

(58) Field of Classification Search
　　　CPC .... H04B 10/2569; H04J 14/06; H04L 1/0039; H03K 7/02
　　　USPC .......................... 375/316, 259, 260, 285, 346
　　　See application file for complete search history.

(56) References Cited

U.S. PATENT DOCUMENTS

2005/0269515 A1* 12/2005 Saleh ........................ G01T 1/17
　　　　　　　　　　　　　　　　　　　　　　　　　　　250/369
2012/0128377 A1　　5/2012 Hatae et al.

\* cited by examiner

FIG. 16

| | | 0 | 1 | 2 | 3 | 4 | ... | 28 | 29 | 30 | 31 |
|---|---|---|---|---|---|---|---|---|---|---|---|
| THRESHOLD #1 (115~113) | COEFFICIENT-115 ZONE | 304 | 658 | 1200 | 2135 | 3034 | | 7774 | 6358 | 5015 | 3654 |
| THRESHOLD #2 (113~111) | COEFFICIENT-113 ZONE | 201 | 470 | 943 | 1824 | 2788 | ... | 8405 | 7034 | 5589 | 4060 |
| | COEFFICIENT-111 ZONE | 110 | 294 | 675 | 1452 | 2471 | | 9114 | 7874 | 6338 | 4535 |
| THRESHOLD #3 (111~109) | COEFFICIENT-109 ZONE | 36 | 119 | 332 | 874 | 1815 | | 10553 | 9720 | 7808 | 5218 |
| THRESHOLD #4 (109~107) | COEFFICIENT-107 ZONE | | | | | | | | | | |

HISTOGRAM CLASS

1600

AMPLITUDE ADJUSTMENT CIRCUIT, DIGITAL COHERENT RECEIVER, AND AMPLITUDE ADJUSTMENT METHOD

CROSS-REFERENCE TO RELATED APPLICATION

This application is based upon and claims the benefit of priority of the prior Japanese Patent Application No. 2016-212660, filed on Oct. 31, 2016, the entire contents of which are incorporated herein by reference.

FIELD

The embodiment discussed herein is related to an amplitude adjustment circuit, a digital coherent receiver, and an amplitude adjustment method.

BACKGROUND

There is an optical digital coherent receiver that carries out coherent reception of optical signals and executes digital processing of the received signals. Furthermore, there is a configuration in which an automatic level control (ALC) processing unit that adjusts the signal level of an output of an adaptive equalization unit to a target value is set in an optical digital coherent receiver. This ALC processing unit may generate a histogram obtained by counting the number of samples regarding discrete monitored values corresponding to the amplitude value of the output from the adaptive equalization unit and decide a level adjustment coefficient by which the output of the adaptive equalization unit is to be multiplied in such a manner that the monitored value of the peak value of the histogram becomes the target value.

However, as described above, there is a problem that the adjustment error of the amplitude becomes large and the error rate becomes high in a multi-valued modulation system such as the 16 quadrature amplitude modulation (QAM).

The following is a reference document.
[Document 1] Japanese Laid-open Patent Publication No. 2012-114599.

SUMMARY

According to an aspect of the embodiment, an amplitude adjustment circuit includes a memory that stores correspondence information between frequency distributions of an amplitude and adjustment coefficients, a processor configured to generate a frequency distribution of amplitude of data for which adaptive equalization processing has been executed, acquire the correspondence information between frequency distributions of the amplitude and adjustment coefficients from the memory, select the adjustment coefficient based on a result of comparison between the frequency distributions included in the correspondence information acquired by the acquiring unit and the frequency distribution generated by the generating unit, and adjust a gain of the data based on the adjustment coefficient selected by the selecting unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 16 is a diagram illustrating one example of a zone correspondence table used by an amplitude adjustment circuit according to the embodiment.

DESCRIPTION OF EMBODIMENT

An amplitude adjustment circuit, a digital coherent receiver, and an amplitude adjustment method according to the embodiment will be described in detail below with reference to the drawings.

Embodiment (Amplitude Adjustment Circuit According to Embodiment)

Figure 1:
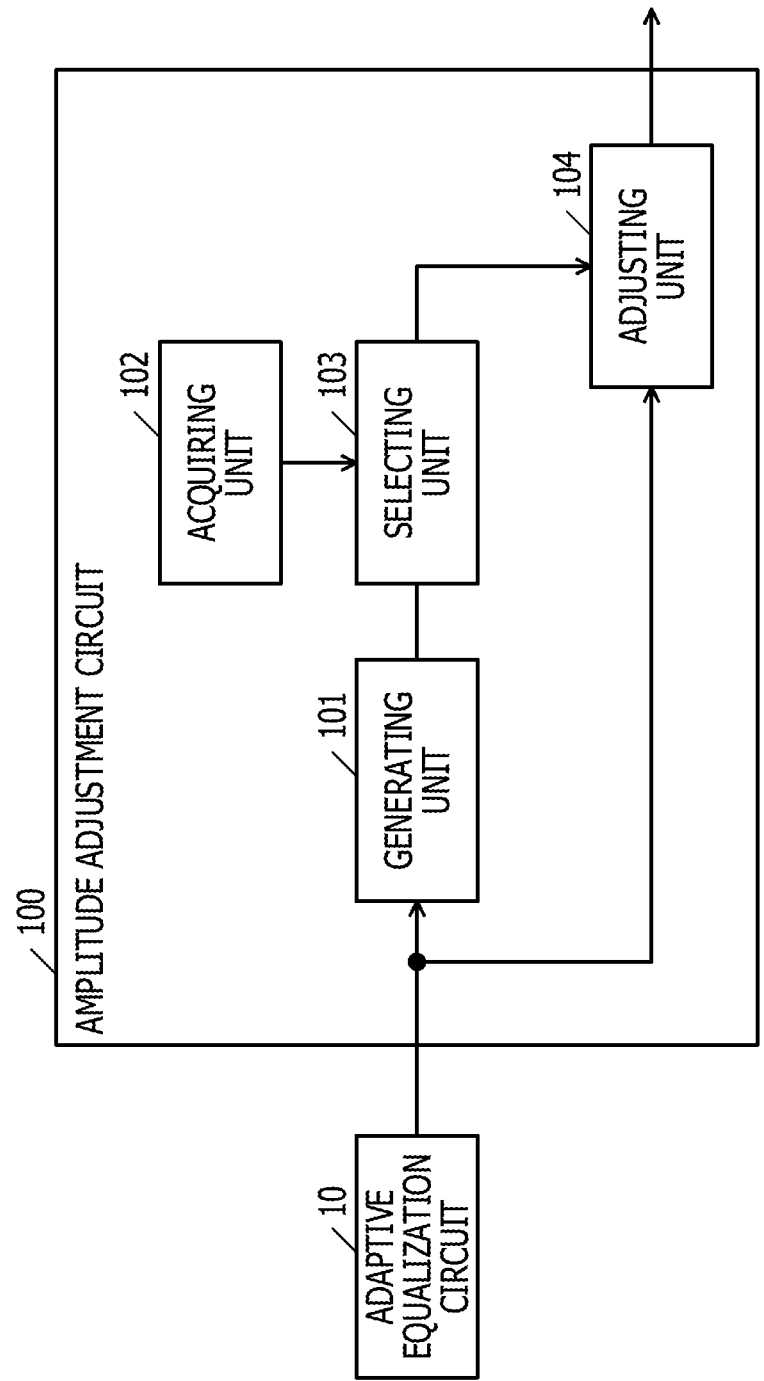
FIG. 1 is a diagram illustrating one example of an amplitude adjustment circuit according to an embodiment.

FIG. 1 is a diagram illustrating one example of an amplitude adjustment circuit according to an embodiment. As illustrated in FIG. 1, an amplitude adjustment circuit 100 according to the embodiment adjusts the amplitude of data (signals) for which adaptive equalization processing has been executed by an adaptive equalization circuit 10 by adjusting the gain for the data for which the adaptive equalization processing has been executed by the adaptive equalization circuit 10.

The adaptive equalization circuit 10 and the amplitude adjustment circuit 100 may be applied to a digital circuit of a digital coherent receiver, for example. The adaptive equalization processing by the adaptive equalization circuit 10 is adaptive equalization processing against time variation of signals due to propagation characteristics of an optical transmission path, for example. Furthermore, the adaptive equalization processing by the adaptive equalization circuit 10 is implemented by a finite impulse response (FIR) filter, for example.

The amplitude adjustment circuit 100 includes a generating unit 101, an acquiring unit 102, a selecting unit 103, and an adjusting unit 104. The generating unit 101 generates a frequency distribution of the amplitude of data output from the adaptive equalization circuit 10. The frequency distribution of the amplitude is information that indicates the frequency in each class when amplitudes obtained as samples are divided into plural class (amplitude intervals), for example, information that indicates the frequency of the amplitude regarding each class (amplitude interval). The class (amplitude interval) is each interval obtained by delimiting ranges of the amplitude at certain intervals, for example. What is obtained by graphing the frequency distribution is a histogram, for example.

As one example, the frequency distribution of the amplitude may be implemented by array information in which the frequencies of the amplitude in the classes (amplitude intervals) are stored. The generating unit 101 outputs the generated frequency distribution to the selecting unit 103.

The acquiring unit 102 acquires correspondence information between frequency distributions of the amplitude and adjustment coefficients of the gain. The correspondence information is a table that indicates the corresponding adjustment coefficient regarding each of plural patterns of frequency distribution of the amplitude in the data of the processing target, for example. The plural patterns of frequency distribution of the amplitude in the data of the processing target are plural patterns of frequency distribution of the amplitude according to the magnitude of noise in the data of the processing target, for example.

For example, the correspondence information is stored in a memory of the amplitude adjustment circuit 100 and the acquiring unit 102 reads out the correspondence information from the memory in the amplitude adjustment circuit 100. Alternatively, the acquiring unit 102 may receive the correspondence information from the external of the amplitude adjustment circuit 100. The acquiring unit 102 outputs the acquired correspondence information to the selecting unit 103.

The selecting unit 103 carries out comparison between each frequency distribution included in the correspondence information output from the acquiring unit 102 and the frequency distribution output from the generating unit 101. Then, based on the result of the comparison, the selecting unit 103 selects the adjustment coefficient used for adjustment of the gain for the data output from the adaptive equalization circuit 10 and outputs the selected adjustment coefficient to the adjusting unit 104.

For example, regarding each of the plural patterns of frequency distribution included in the correspondence information, the selecting unit 103 carries out comparison of the frequency of each class with the frequency distribution output from the generating unit 101. Furthermore, based on the result of the comparison, the selecting unit 103 identifies the frequency distribution closest to the frequency distribution output from the generating unit 101 among the frequency distributions included in the correspondence information. Then, the selecting unit 103 selects the adjustment coefficient corresponding to the identified frequency distribution among the adjustment coefficients included in the correspondence information.

The adjusting unit 104 adjusts the gain of the data output from the adaptive equalization circuit 10 based on the adjustment coefficient output from the selecting unit 103. For example, the adjusting unit 104 adjusts the gain by multiplying the data output from the adaptive equalization circuit 10 by the adjustment coefficient output from the selecting unit 103. Then, the adjusting unit 104 outputs the data whose gain has been adjusted.

According to the amplitude adjustment circuit 100, the adjustment coefficient of the gain may be selected based on the result of the comparison between the frequency distributions included in the correspondence information between the frequency distributions of the amplitude and the adjustment coefficients and the frequency distribution of the amplitude of the signals of the processing target. Due to this, an appropriate adjustment coefficient according to noise in the signals of the processing target is selected. Thus, the adjustment error of the amplitude may be made small and reduction in the error rate may be intended.

The adaptive equalization circuit 10, the generating unit 101, the acquiring unit 102, the selecting unit 103, and the adjusting unit 104 may be implemented by various kinds of digital circuits such as a digital signal processor (DSP). For example, the adaptive equalization circuit 10, the generating unit 101, the acquiring unit 102, the selecting unit 103, and the adjusting unit 104 may be implemented by a processor that is included in a DSP or the like and may access a memory.

(Constellation of Signals in Amplitude Adjustment Circuit According to Embodiment)

Figure 2:
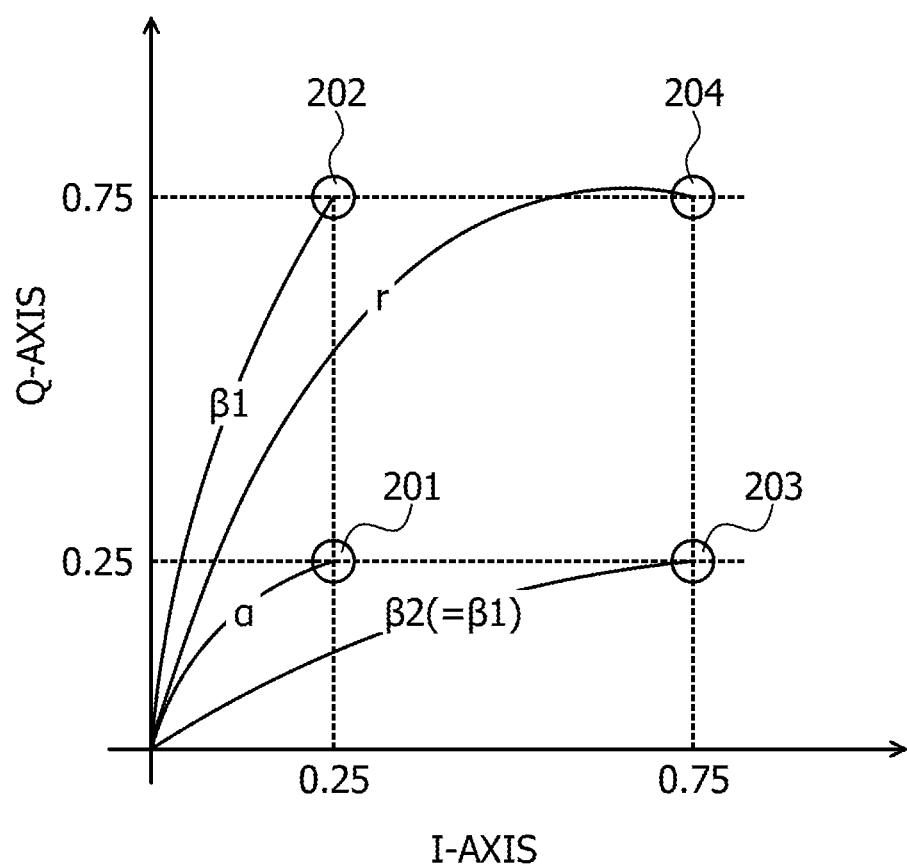
FIG. 2 is a diagram illustrating one example of constellation of signals in an amplitude adjustment circuit according to the embodiment.

FIG. 2 is a diagram illustrating one example of constellation of signals in an amplitude adjustment circuit according to the embodiment. In FIG. 2, the abscissa axis represents the real axis (I-axis) and the ordinate axis represents the imaginary axis (Q-axis). Furthermore, in the example illustrated in FIG. 2, a digital coherent receiver to which the amplitude adjustment circuit 100 is applied receives optical signals of the 16 QAM. The 16 QAM is a digital modulation system with which 16 kinds of information may be sent by one symbol. Thus, the number of signal points (symbols) of the constellation of signals in the amplitude adjustment circuit 100 is 16. However, in FIG. 2, four signal points 201 to 204 of one quadrant among the 16 signal points are represented.

The signal points 201 to 204 represent the target amplitude and the target phase of the respective symbols. The target amplitude value of the signal point 201 is defined as $\alpha$ and the target amplitude value of the signal point 202 is defined as $\beta 1$. The target amplitude value of the signal point 203 is defined as $\beta 2$ and the target amplitude value of the signal point 204 is defined as $\gamma$. The target amplitude value $\beta 1$ of the signal point 202 is the same as the target amplitude value $\beta 2$ of the signal point 203 ($\beta 1 = \beta 2$).

(Histograms of Amplitude Value of Input Signals to Amplitude Adjustment Circuit According to Embodiment)

Figure 3:
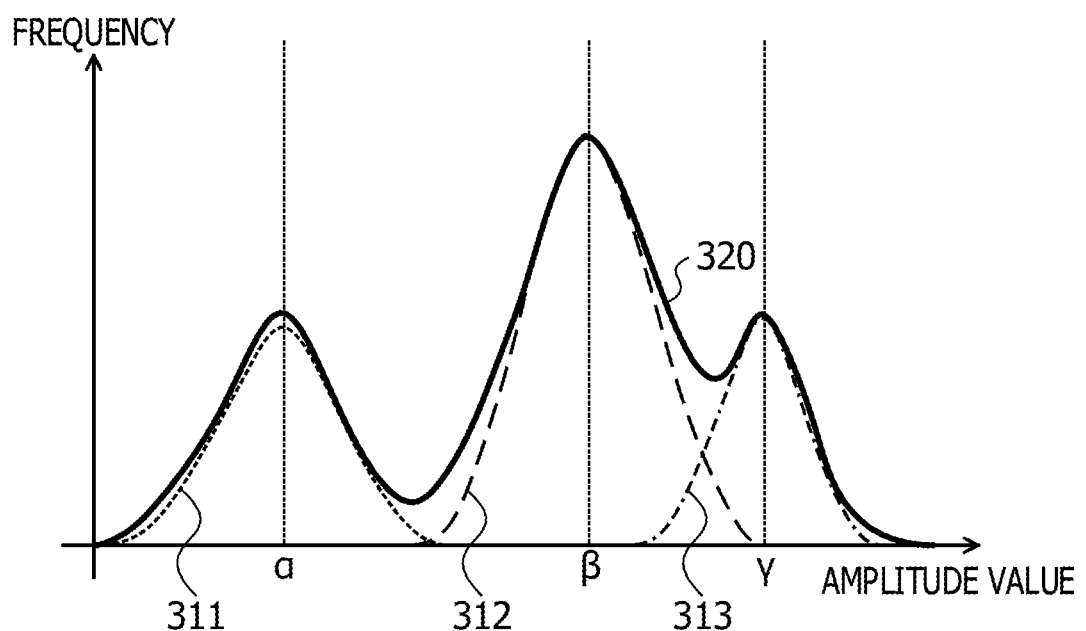
FIG. 3 is a diagram illustrating one example of histograms of amplitude values of input signals to an amplitude adjustment circuit according to the embodiment (noise is small)

FIG. 3 is a diagram illustrating one example of histograms of amplitude values of input signals to an amplitude adjustment circuit according to the embodiment (noise is small). In histograms 311 to 313 in FIG. 3, the abscissa axis represents the amplitude value of the signals input to the amplitude adjustment circuit 100 and the ordinate axis represents the frequency. Furthermore, in FIG. 3, the histograms 311 to 313 of the amplitude value when noise of the optical transmission path and so forth is comparatively small are represented.

The histogram 311 represents the frequency distribution of the amplitude value of a signal corresponding to a signal point whose target amplitude value is α (for example, the signal point 201 represented in FIG. 2) among the signals input to the amplitude adjustment circuit 100. Because the noise of the optical transmission path and so forth is comparatively small in the example illustrated in FIG. 3, the peak of the frequency in the histogram 311 is a value close to the amplitude value α.

The histogram 312 represents the frequency distribution of the amplitude value of a signal corresponding to a signal point whose target amplitude value is β (β=β1=β2) (for example, the signal point 202 or 203 represented in FIG. 2) among the signals input to the amplitude adjustment circuit 100. Because the noise of the optical transmission path and so forth is comparatively small in the example illustrated in FIG. 3, the peak of the frequency in the histogram 312 is a value close to the amplitude value β.

The histogram 313 represents the frequency distribution of the amplitude value of a signal corresponding to a signal point whose target amplitude value is γ (for example, the signal point 204 represented in FIG. 2) among the signals input to the amplitude adjustment circuit 100. Because the noise of the optical transmission path and so forth is comparatively small in the example illustrated in FIG. 3, the peak of the frequency in the histogram 313 is a value close to the amplitude value γ.

A histogram 320 is the frequency distribution of the amplitude value of the signals of the respective target amplitude values input to the amplitude adjustment circuit 100. For example, the histogram 320 is a histogram obtained by adding the histograms 311 to 313 to each other. Furthermore, in the 16 QAM, the number of signal points of the target amplitude value β is larger than each of the numbers of signal points of the target amplitude values α and γ (for example, see FIG. 2). For this reason, the peak value of the histogram 320 is a value close to β.

Figure 4:
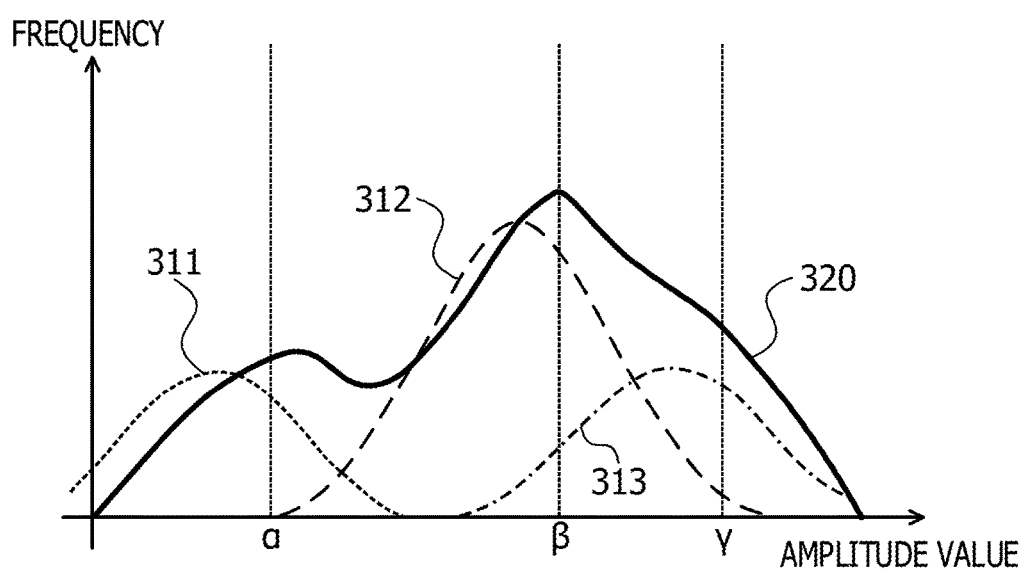
FIG. 4 is a diagram illustrating one example of histograms of amplitude values of input signals to an amplitude adjustment circuit according to the embodiment (noise is large)

FIG. 4 is a diagram illustrating one example of histograms of amplitude values of input signals to an amplitude adjustment circuit according to the embodiment (noise is large). In FIG. 4, a part similar to the part represented in FIG. 3 is given the same numeral and description thereof is omitted. Furthermore, in FIG. 4, histograms of the amplitude value when noise of the optical transmission path and so forth is comparatively large are represented.

If the noise of the optical transmission path and so forth is comparatively large, the peaks of the histograms 311 to 313 individually deviate from α, β, and γ. In the example illustrated in FIG. 4, the respective peak values of the histograms 311 to 313 are small amplitude values compared with the example illustrated in FIG. 3. On the other hand, the peak value of the histogram 320 as the sum of the histograms 311 to 313 is a value close to β similarly to FIG. 3 because the dispersion becomes large.

Therefore, for example, with determination based on the peak value of the histogram 320, it is difficult to select the appropriate gain adjustment coefficient (adjustment coefficient of the gain) according to the magnitude of the noise of the optical transmission path and so forth. This problem occurs in the 16 QAM and also occurs in various kinds of modulation systems (for example, various kinds of QAM) in which symbols having different amplitudes exist in a mixed manner, such as 4 QAM, 8 QAM, 32 QAM, and 64 QAM.

In contrast, in the amplitude adjustment circuit 100, the gain adjustment coefficient is selected based on the shape of the whole of the histogram 320 and thereby selection of the appropriate gain adjustment coefficient according to the magnitude of the noise of the optical transmission path and so forth is enabled.

(Relationship Between Histograms of Input Signals to Amplitude Adjustment Circuit According to Embodiment and Magnitude of Noise)

Figure 5:
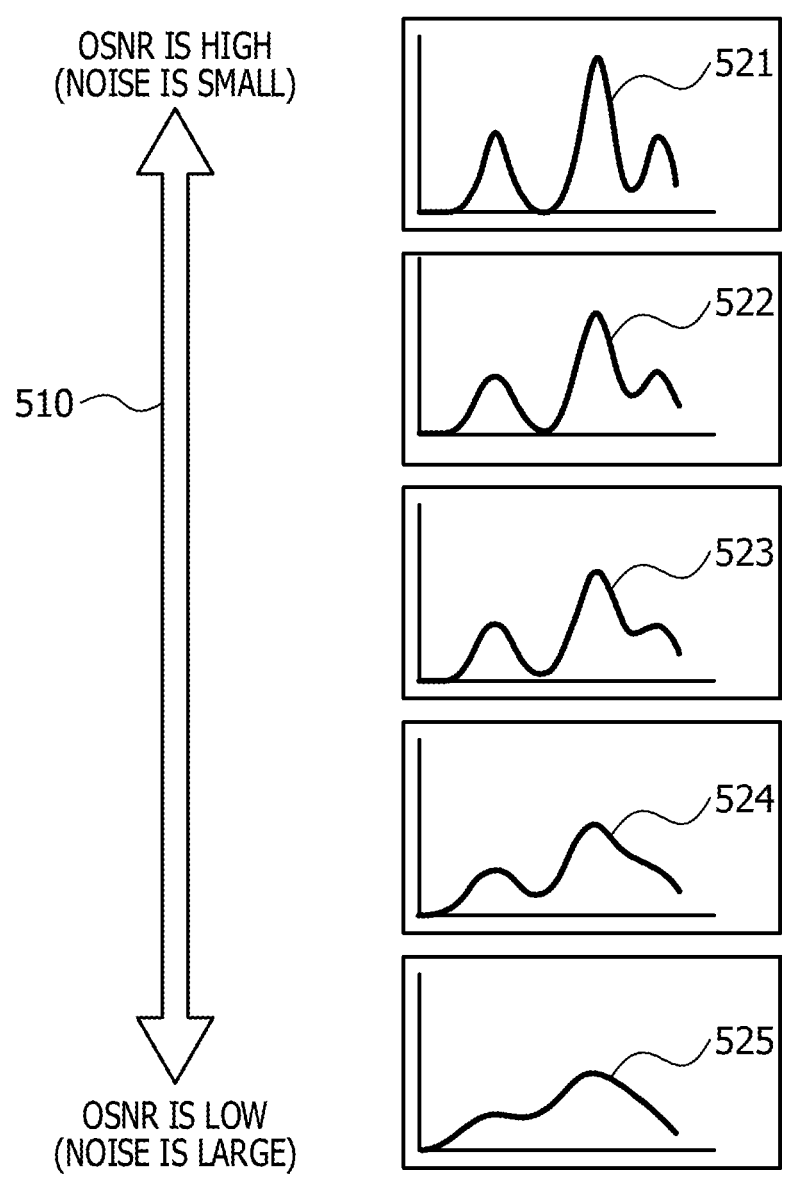
FIG. 5 is a diagram illustrating one example of relationships between histograms of input signals to an amplitude adjustment circuit according to the embodiment and magnitude of noise.

FIG. 5 is a diagram illustrating one example of a relationship between histograms of input signals to an amplitude adjustment circuit according to the embodiment and magnitude of noise. An OSNR 510 illustrated in FIG. 5 represents the magnitude of the OSNR of the input signals to the amplitude adjustment circuit 100, for example, the magnitude of noise. The OSNR is an abbreviation of optical signal noise ratio (optical signal-to-noise ratio).

Histograms 521 to 525 represent histograms of the amplitude values of the input signals to the amplitude adjustment circuit 100 according to the magnitude of the OSNR 510. Each of the histograms 521 to 525 is a histogram in which the abscissa axis represents the amplitude value and the ordinate axis represents the frequency similarly to the histograms illustrated in FIG. 3 and FIG. 4. The histograms 521 to 525 are the respective histograms according to the magnitude of the OSNR 510. The histogram 521 is the histogram when the OSNR 510 is highest (noise is small) and the histogram 525 is the histogram when the OSNR 510 is lowest (noise is large).

As represented in the histograms 521 to 525, in the input signals to the amplitude adjustment circuit 100, as the OSNR 510 becomes lower (noise becomes larger), the dispersion of the amplitude value becomes larger although change in the amplitude value at which the peak of the frequency appears is small. Therefore, the appropriate gain adjustment coefficient according to the OSNR 510 (noise) may be selected by selecting the gain adjustment coefficient according to the histograms 521 to 525.

(Correspondence Information Used by Amplitude Adjustment Circuit According to Embodiment)

Figure 6:
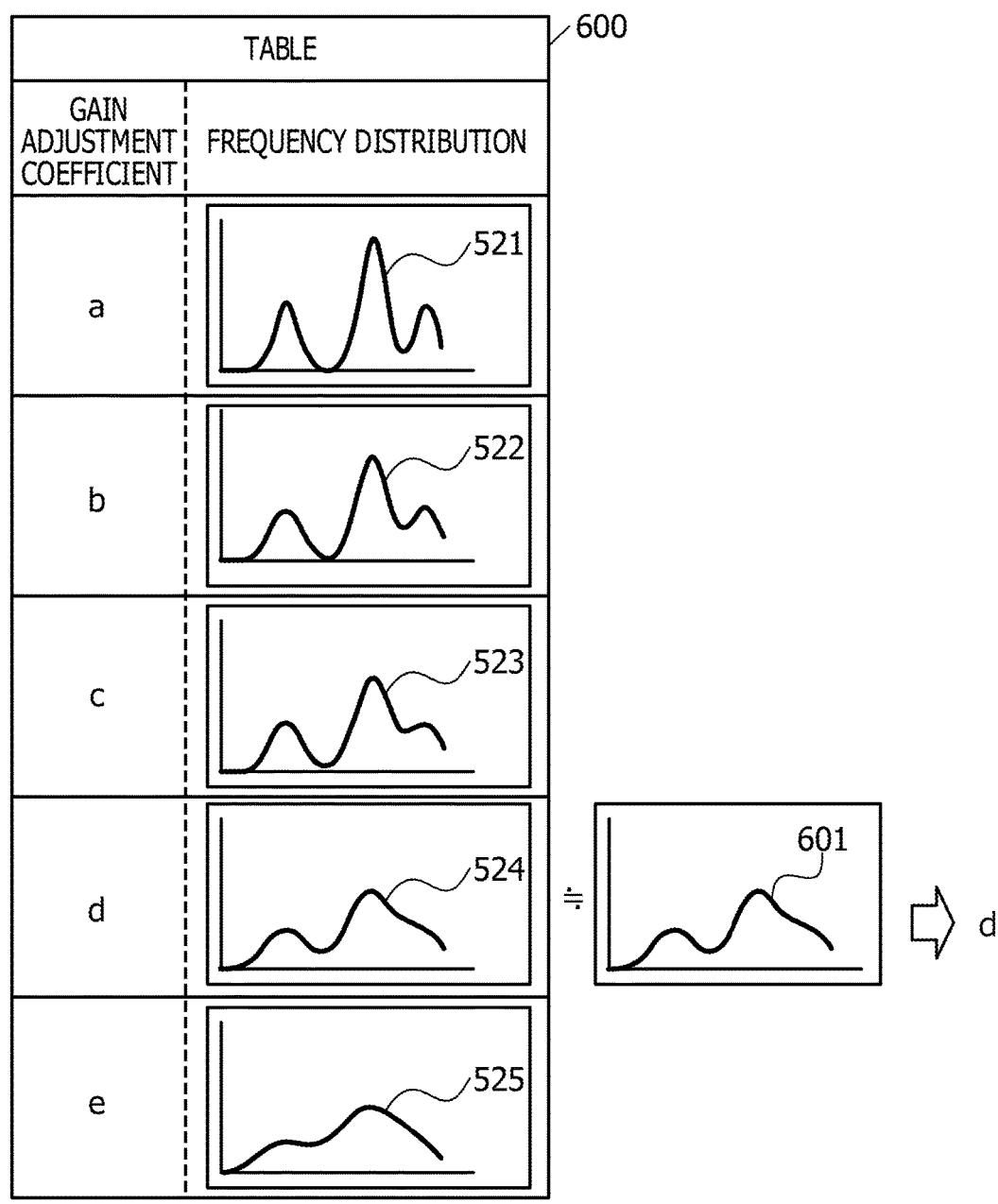
FIG. 6 is a diagram illustrating one example of correspondence information used by an amplitude adjustment circuit according to the embodiment.

FIG. 6 is a diagram illustrating one example of correspondence information used by an amplitude adjustment circuit according to the embodiment. The amplitude adjustment circuit 100 uses correspondence information 600 illustrated in FIG. 6, for example, as the above-described correspondence information between frequency distributions of the amplitude and adjustment coefficients. The correspondence information 600 is correspondence information between frequency distributions (histogram arrays) and gain adjustment coefficients. The frequency distributions of the correspondence information 600 are arrays that represent the histograms 521 to 525 illustrated in FIG. 5, for example. However, the frequency distributions are represented by histograms in FIG. 6.

For example, in the correspondence information 600, a gain adjustment coefficient a is associated with the frequency distribution that represents the histogram 521. The gain adjustment coefficient a is the gain adjustment coefficient with which the reception quality becomes highest when the histogram of the amplitude value of signals input to the amplitude adjustment circuit 100 is the histogram 521. The reception quality is the Q-factor, for example. The Q-factor is an index that represents the quality of the digital signal and is a value that represents the level ratio between noise and the signal. A higher Q-factor represents higher signal quality.

Similarly, in the correspondence information 600, gain adjustment coefficients b to e are individually associated with the frequency distributions that represent the histograms 522 to 525. The gain adjustment coefficients b to e are the gain adjustment coefficients with which the reception quality becomes highest when the histogram of the amplitude value of signals input to the amplitude adjustment circuit 100 is the histogram 522 to 525, individually.

The amplitude adjustment circuit 100 identifies the frequency distribution closest to the frequency distribution of the amplitude value of input signals among the respective frequency distributions that represent the histograms 521 to 525. Methods for identifying the closest frequency distribution will be described later. The amplitude adjustment circuit 100 selects the gain adjustment coefficient associated with the identified frequency distribution among the respective gain adjustment coefficients in the correspondence information 600 as the gain adjustment coefficient applied to the input signals to the amplitude adjustment circuit 100 (for example, through multiplication).

A histogram 601 illustrated in FIG. 6 is an example of the histogram of the amplitude value of signals actually input to the amplitude adjustment circuit 100. The amplitude adjustment circuit 100 generates a frequency distribution that represents the histogram 601. In the example illustrated in FIG. 6, the histogram 524 among the histograms 521 to 525 is the closest to the histogram 601. In this case, the amplitude adjustment circuit 100 selects the gain adjustment coefficient d as the gain adjustment coefficient applied to the input signals to the amplitude adjustment circuit 100.

(Correspondence Table Used by Amplitude Adjustment Circuit According to Embodiment)

Figure 7:
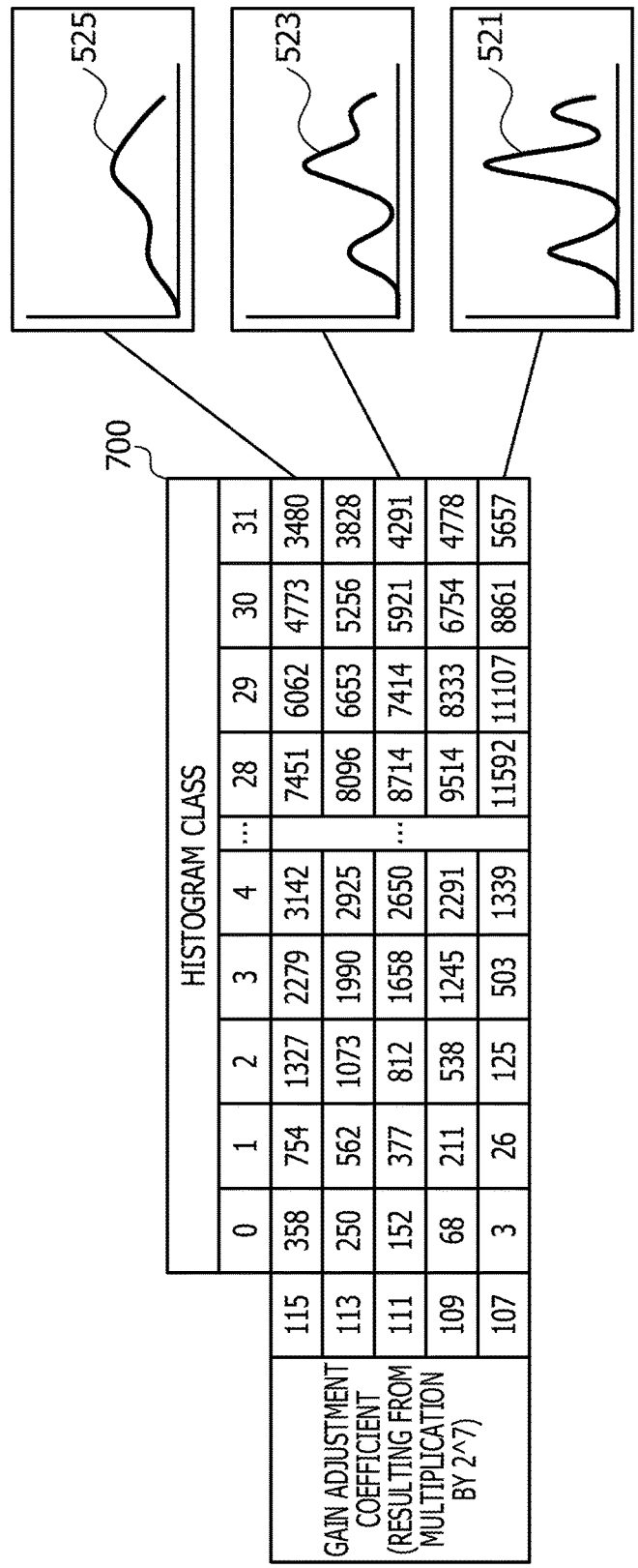
FIG. 7 is a diagram illustrating one example of a correspondence table used by an amplitude adjustment circuit according to the embodiment.

FIG. 7 is a diagram illustrating one example of a correspondence table used by an amplitude adjustment circuit according to the embodiment. The amplitude adjustment circuit 100 uses a correspondence table 700 illustrated in FIG. 7, for example, as the correspondence information 600 illustrated in FIG. 6.

The correspondence table 700 is correspondence information between frequency distributions of the amplitude value and gain adjustment coefficients. The frequency distribution is the frequency of each histogram class. The histogram class is each interval obtained by delimiting amplitude ranges with arbitrary values. In the correspondence table 700, 32 histogram classes given numbers of 0 to 31 are used.

Furthermore, in the example illustrated in FIG. 7, in the correspondence table 700, five frequency distributions that represent the histograms 521 to 525 illustrated in FIG. 5 and five gain adjustment coefficients corresponding to the histograms 521 to 525 are included, for example.

For example, the first row of the correspondence table 700 is the frequency distribution that represents the histogram 525. Furthermore, this frequency distribution that represents the histogram 525 indicates the frequency (358, 754, 1327, 2279, 3142, . . . , 7451, 6062, 4773, 3480) of each histogram class (0, 1, 2, 3, 4, . . . , 28, 29, 30, 31). Moreover, the third row of the correspondence table 700 is the frequency distribution that represents the histogram 523. In addition, the fifth row of the correspondence table 700 is the frequency distribution that represents the histogram 521.

Furthermore, in the example illustrated in FIG. 7, the five gain adjustment coefficients included in the correspondence table 700 are 115, 113, 111, 109, and 107. However, these gain adjustment coefficients represented in FIG. 7 are values resulting from multiplication of actual gain adjustment coefficients by $2^7$.

For example, suppose that the frequency distribution of the amplitude value of signals input to the amplitude adjustment circuit 100 is closest to the frequency distribution that represents the histogram 525. In this case, the amplitude adjustment circuit 100 selects 115 (in practice, $115/2^7$), which is the gain adjustment coefficient associated with the frequency distribution of the histogram 525.

One example of a method for generating the correspondence table 700 by a simulation will be described. First, a simulation is carried out in which the Q-factor of received signals in a digital coherent receiver to which the amplitude adjustment circuit 100 is applied is measured while the gain adjustment coefficient is changed. Furthermore, this simulation is carried out regarding plural kinds of OSNR. This may plot the correspondence relationship between the gain adjustment coefficient and the Q-factor regarding the plural kinds of OSNR. Furthermore, in this simulation, frequency distributions of the amplitude value of signals input to the amplitude adjustment circuit 100 are generated and stored.

Next, regarding the plural kinds of OSNR, the gain adjustment coefficient with which the Q-factor becomes highest is identified based on the correspondence relationship between the gain adjustment coefficient and the Q-factor. Then, regarding each of the plural kinds of OSNR, the identified gain adjustment coefficient and the frequency distribution generated and stored in the simulation of the OSNR are associated. This may generate the correspondence table 700 in which the frequency distribution and the gain adjustment coefficient with which the Q-factor becomes highest at the OSNR to which the frequency distribution corresponds are associated.

Although the method for generating the correspondence table 700 by a simulation is described, the generation method of the correspondence table 700 is not limited to the method by a simulation. For example, the correspondence table 700 may be generated based on the result of actual measurement with use of the digital coherent receiver to which the amplitude adjustment circuit 100 is applied.

(ALC Unit According to Embodiment)

Figure 8:
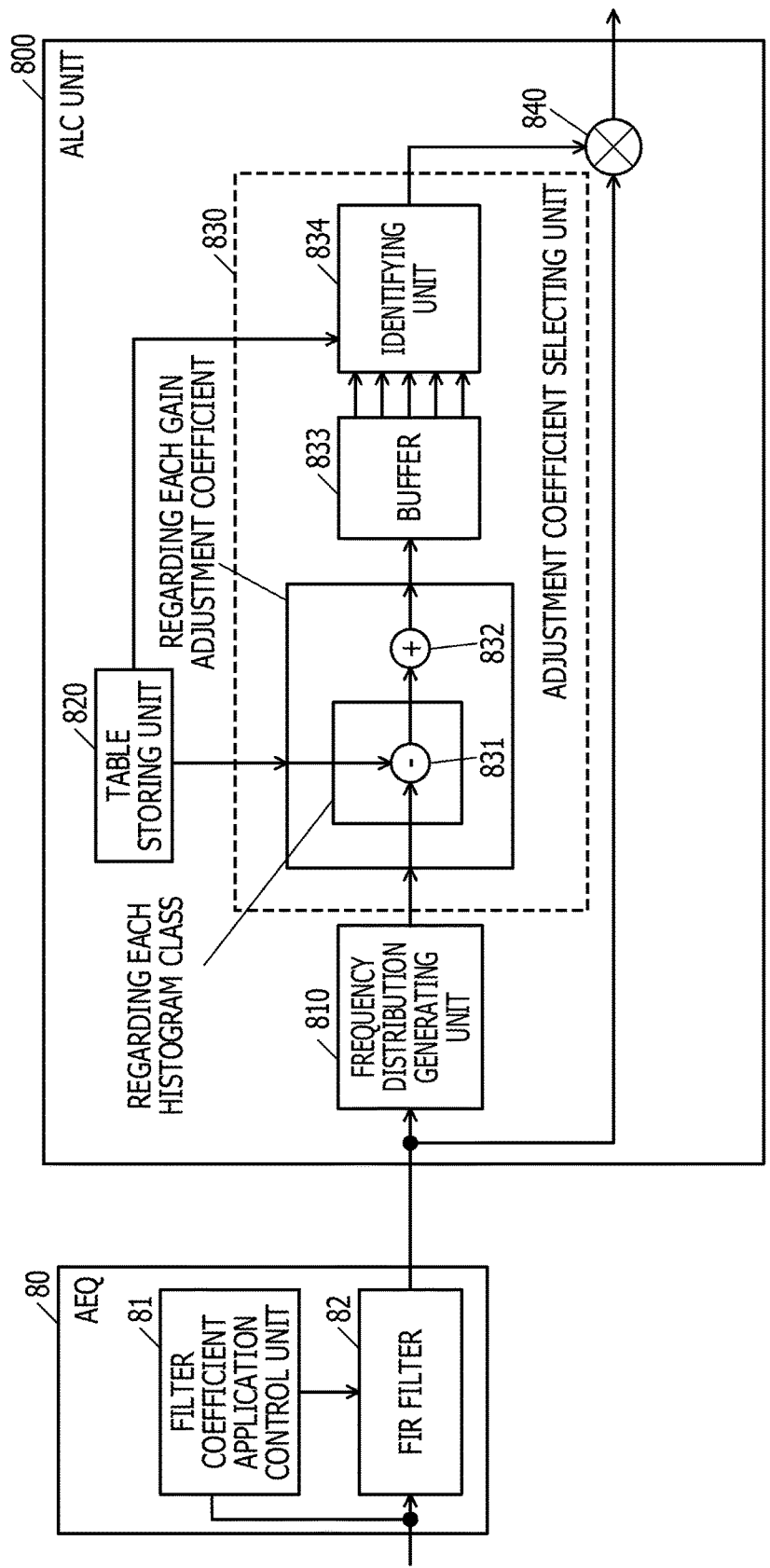
FIG. 8 is a diagram illustrating one example of an ALC unit according to the embodiment.

FIG. 8 is a diagram illustrating one example of an ALC unit according to the embodiment. The above-described amplitude adjustment circuit 100 may be implemented by an ALC unit 800 illustrated in FIG. 8, for example. The ALC unit 800 is set at the subsequent stage of an AEQ 80, for example. The AEQ is an abbreviation of adaptive equalizer. The ALC unit 800 includes a filter coefficient application control unit 81 and an FIR filter 82.

The filter coefficient application control unit 81 controls filter coefficients (tap coefficients) applied to the FIR filter 82 based on signals input to the AEQ 80. The FIR filter 82 executes adaptive equalization processing for the signals input to the AEQ 80. For example, the FIR filter 82 executes the adaptive equalization processing by carrying out filtering with the filter coefficients applied based on the control by the filter coefficient application control unit 81. The FIR filter 82 outputs the signals resulting from the adaptive equalization processing to the ALC unit 800.

The ALC unit 800 includes a frequency distribution generating unit 810, a table storing unit 820, an adjustment coefficient selecting unit 830, and a gain adjusting unit 840. The frequency distribution generating unit 810 generates the frequency distribution of the amplitude value of signals output from the AEQ 80. As one example, the frequency distribution generating unit 810 accumulates the amplitudes of the signals output from the AEQ 80 and generates a frequency distribution based on a given number of latest amplitudes among the respective accumulated amplitudes at the update timing of the gain adjustment coefficient of the gain adjusting unit 840. Then, the frequency distribution generating unit 810 outputs the generated frequency distribution to the adjustment coefficient selecting unit 830.

The table storing unit 820 stores a correspondence table that represents the correspondence relationship between frequency distributions of the amplitude value and gain adjustment coefficients. As one example, the table storing unit 820 stores the correspondence table 700 illustrated in FIG. 7. The histogram classes of each frequency distribution included in the correspondence table stored in the table storing unit 820 are common with the classes of the frequency distribution generated by the frequency distribution generating unit 810, for example.

The adjustment coefficient selecting unit 830 selects the gain adjustment coefficient based on the frequency distribution output from the frequency distribution generating unit 810 and the correspondence table stored in the table storing unit 820. For example, the adjustment coefficient selecting unit 830 includes a difference calculating unit 831, a cumulative addition unit 832, a buffer 833, and an identifying unit 834.

The difference calculating unit 831 calculates the difference (absolute value) between the frequency of the frequency distribution output from the frequency distribution generating unit 810 and the frequency of the frequency distribution included in the correspondence table stored in the table storing unit 820. The calculation of the difference in the frequency by the difference calculating unit 831 is carried out regarding each of the histogram classes common to each frequency distribution. Furthermore, the calculation of the difference regarding each histogram class is carried out regarding each of the frequency distributions included in the correspondence table stored in the table storing unit 820, for example, regarding each of the gain adjustment coefficients. The difference calculating unit 831 outputs the difference of each histogram class calculated regarding each gain adjustment coefficient to the cumulative addition unit 832.

The cumulative addition unit 832 calculates the cumulative sum of the difference of each histogram class output from the difference calculating unit 831 regarding each gain adjustment coefficient. This may calculate the total value of the difference in the frequency regarding each gain adjustment coefficient. The cumulative addition unit 832 stores the calculated total value of each gain adjustment coefficient in the buffer 833. The buffer 833 holds the total value of each gain adjustment coefficient stored by the cumulative addition unit 832.

The identifying unit 834 identifies the smallest total value from the total values of the respective gain adjustment coefficients held by the buffer 833. Then, the identifying unit 834 acquires the gain adjustment coefficient corresponding to the identified total value from the table storing unit 820 and outputs the acquired gain adjustment coefficient to the gain adjusting unit 840.

In this manner, regarding each of the frequency distributions included in the correspondence table of the table storing unit 820, the adjustment coefficient selecting unit 830 illustrated in FIG. 8 calculates the total of the difference in the frequency of each class from the frequency distribution generated by the frequency distribution generating unit 810. Then, the adjustment coefficient selecting unit 830 identifies the frequency distribution whose calculated total is the smallest among the frequency distributions included in the correspondence table. This may identify the frequency distribution closest to the frequency distribution generated by the frequency distribution generating unit 810 among the frequency distributions included in the correspondence table. Furthermore, processing that involves expansion of the circuit scale, such as division, does not need to be executed and therefore increase in the circuit scale may be suppressed.

The gain adjusting unit 840 adjusts the gain of the signals output from the AEQ 80 by the gain adjustment coefficient output from the adjustment coefficient selecting unit 830. For example, the gain adjusting unit 840 multiplies the signals output from the AEQ 80 by the gain adjustment coefficient output from the adjustment coefficient selecting unit 830. The gain adjusting unit 840 outputs the signals whose gain has been adjusted. This allows the ALC unit 800 to adjust the amplitude of the signals output from the AEQ 80 and output the signals.

Although the case in which signals of one system are input to the ALC unit 800 is described, signals of plural systems may be input to the ALC unit 800. As one example, the signals of the plural systems input to the ALC unit 800 are the respective signals (for example, I signals and Q signals) obtained by splitting optical signals received through the optical transmission path into vertically-polarized waves and horizontally-polarized waves.

In this case, the ALC unit 800 carries out the selection of the gain adjustment coefficient and the gain adjustment described in FIG. 8 regarding the input signals of each of the plural systems, for example. Alternatively, the ALC unit 800 may carry out the selection of the gain adjustment coefficient described in FIG. 8 based on the input signals of part of the plural systems and carry out the gain adjustment for the input signals of the plural systems by using the selected gain adjustment coefficient. This may reduce the amount of processing for the selection of the gain adjustment coefficient.

The adaptive equalization circuit 10 illustrated in FIG. 1 may be implemented by the AEQ 80, for example. The generating unit 101 illustrated in FIG. 1 may be implemented by the frequency distribution generating unit 810, for example. The acquiring unit 102 illustrated in FIG. 1 may be implemented by the table storing unit 820 and the adjustment coefficient selecting unit 830, for example. The selecting unit 103 illustrated in FIG. 1 may be implemented by the adjustment coefficient selecting unit 830, for example. The adjusting unit 104 illustrated in FIG. 1 may be implemented by the gain adjusting unit 840, for example.

(Setting Processing of ALC Unit Based on Amplitude Adjustment Unit According to Embodiment)

Figure 9:
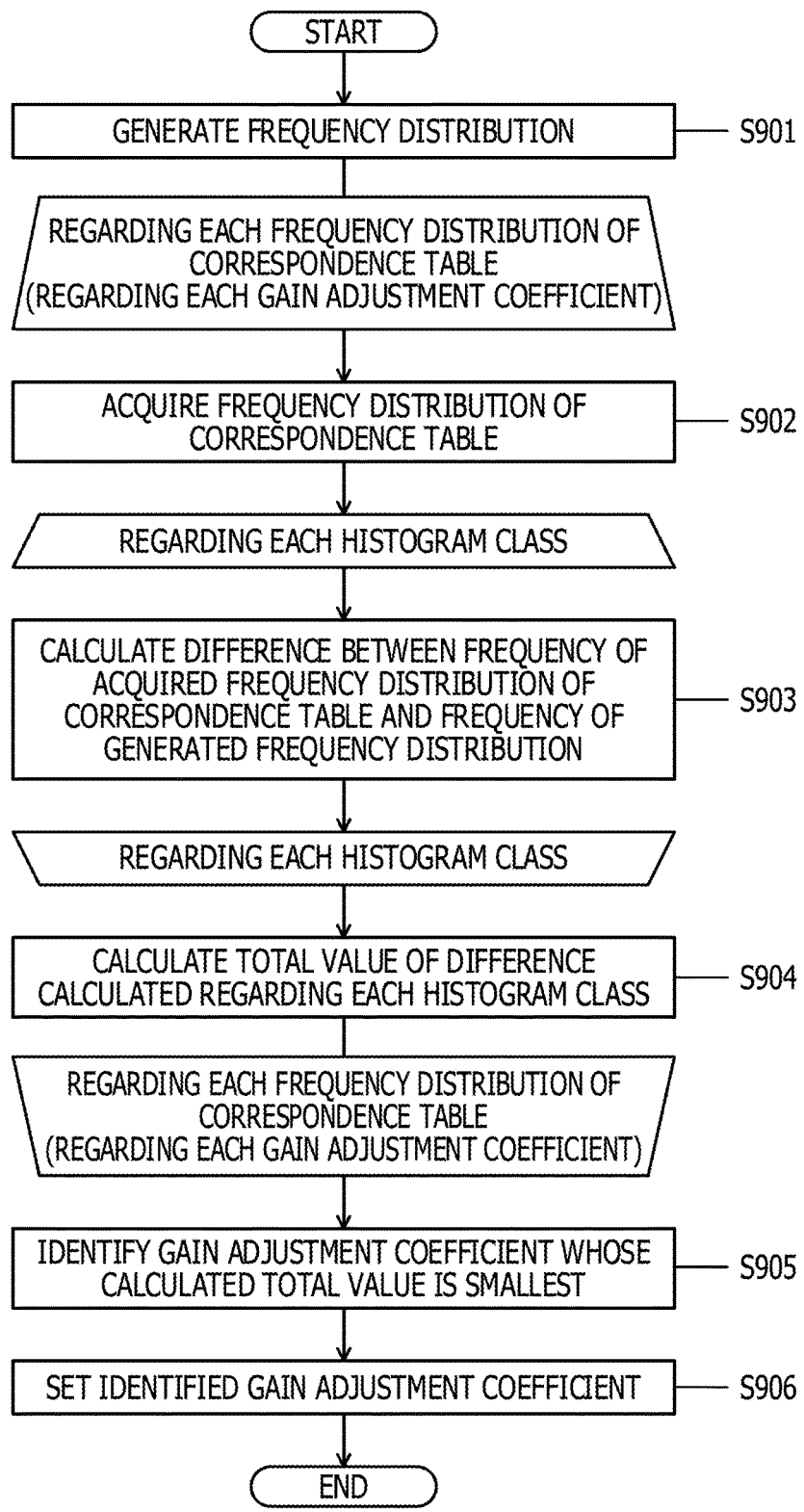
FIG. 9 is a flowchart illustrating one example of setting processing of an ALC unit based on an amplitude adjustment unit according to the embodiment.

FIG. 9 is a flowchart illustrating one example of setting processing of an ALC unit based on an amplitude adjustment unit according to the embodiment. The ALC unit 800 illustrated in FIG. 8 carries out the respective steps represented in FIG. 9, for example. First, the ALC unit 800 generates the frequency distribution of the amplitude value of signals output from the AEQ 80 by accumulating a given number of amplitude values of signals output from the AEQ 80 (step S901). The step S901 is carried out by the frequency distribution generating unit 810 illustrated in FIG. 8, for example.

Next, the ALC unit 800 carries out steps S902 to S904 regarding each frequency distribution of the correspondence table stored in the table storing unit 820 (for example, regarding each gain adjustment coefficient). For example, the ALC unit 800 acquires the frequency distribution of the target in the correspondence table (step S902). The step S902 is carried out by the difference calculating unit 831 illustrated in FIG. 8, for example.

Next, the ALC unit 800 carries out the step S903 regarding each histogram class. For example, the ALC unit 800 calculates the difference between the frequency of the histogram class of the target in the frequency distribution of the correspondence table acquired by the step S902 and the frequency of the histogram class of the target in the frequency distribution generated by the step S901 (step S903). The step S903 is carried out by the difference calculating unit 831 illustrated in FIG. 8, for example.

Next, the ALC unit 800 calculates the total value of the difference calculated by the step S903 regarding each histogram class (step S904). The step S904 is carried out by the cumulative addition unit 832 illustrated in FIG. 8, for example. Furthermore, the total value of each frequency distribution (for example, each gain adjustment coefficient) of the correspondence table calculated by the step S904 is stored in the buffer 833 illustrated in FIG. 8, for example.

Next, the ALC unit 800 identifies the gain adjustment coefficient whose total value calculated regarding each frequency distribution (for example, each gain adjustment coefficient) of the correspondence table is the smallest (step S905). The step S905 is carried out by the identifying unit 834 illustrated in FIG. 8, for example.

Next, the ALC unit 800 sets the gain adjustment coefficient identified by the step S905 for gain adjustment applied to the signals input to the ALC unit 800 (step S906) and ends the series of setting processing. The step S906 is carried out by the gain adjusting unit 840 illustrated in FIG. 8, for example.

The respective steps represented in FIG. 9 are carried out at the time of start-up of the digital coherent receiver to which the ALC unit 800 is applied, for example. Alternatively, the respective steps represented in FIG. 9 may be periodically carried out in operation of the digital coherent receiver to which the ALC unit 800 is applied or be carried out at timing when an instruction from the administrator is made.

(Digital Coherent Receiver According to Embodiment)

Figure 10:
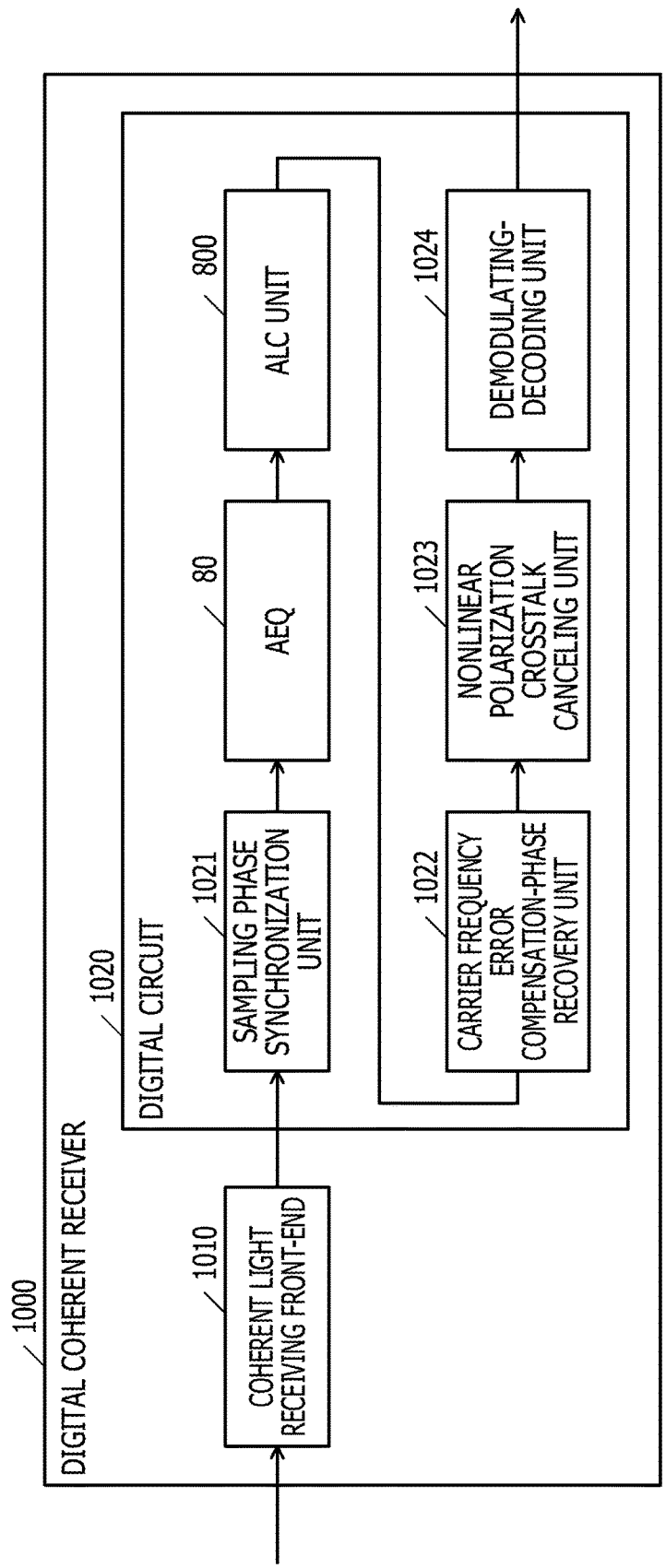
FIG. 10 is a diagram illustrating one example of a digital coherent receiver according to the embodiment.

FIG. 10 is a diagram illustrating one example of a digital coherent receiver according to the embodiment. In FIG. 10, a part similar to the part illustrated in FIG. 8 is given the same numeral and description thereof is omitted. As illustrated in FIG. 10, a digital coherent receiver 1000 according to the embodiment includes a coherent light receiving front-end 1010 and a digital circuit 1020.

The coherent light receiving front-end 1010 is an optical front-end (light reception processing unit) that carries out coherent reception of signal light (optical signals) input to the digital coherent receiver 1000 through an optical transmission path by using local light of the digital coherent receiver 1000.

For example, the coherent light receiving front-end 1010 receives light in such a manner as to mix the input signal light and the local light. Due to this, the respective signals of an H-axis polarized component and a V-axis polarized component included in the signal light input from the transmission path to the digital coherent receiver 1000 are obtained. The H-axis polarized component and the V-axis polarized component are the respective polarized components whose polarization directions are orthogonal to each other. Furthermore, the respective signals of the H-axis polarized component and the V-axis polarized component include an I-channel (in-phase) component and a Q-channel (quadrature) component, respectively, for example.

The coherent light receiving front-end 1010 converts the respective obtained signals of the H-axis polarized component and the V-axis polarized component to digital signals and outputs the respective signals converted to the digital signals to the digital circuit 1020. The digital circuit 1020 executes reception processing of the signals output from the coherent light receiving front-end 1010. The digital circuit 1020 may be implemented by various kinds of digital circuits such as a DSP.

For example, the digital circuit 1020 includes a sampling phase synchronization unit 1021, the AEQ 80, the ALC unit 800, a carrier frequency error compensation-phase recovery unit 1022, a nonlinear polarization crosstalk canceling unit 1023, and a demodulating-decoding unit 1024.

The sampling phase synchronization unit 1021 executes synchronization processing of the sampling phase for the respective signals output from the coherent light receiving front-end 1010. Then, the sampling phase synchronization unit 1021 outputs the respective signals resulting from the synchronization processing of the sampling phase to the AEQ 80. The AEQ 80 executes adaptive equalization processing for the respective signals output from the sampling phase synchronization unit 1021. Then, the AEQ 80 outputs the respective signals resulting from the adaptive equalization processing to the ALC unit 800.

The ALC unit 800 carries out amplitude adjustment for the signals output from the AEQ 80. Then, the ALC unit 800 outputs the respective signals resulting from the amplitude adjustment to the carrier frequency error compensation-phase recovery unit 1022. The carrier frequency error compensation-phase recovery unit 1022 carries out compensation of the carrier frequency error and recovery of the phase for the respective signals output from the ALC unit 800. Then, the carrier frequency error compensation-phase recovery unit 1022 outputs the respective signals resulting from the compensation of the carrier frequency error and the recovery of the phase to the nonlinear polarization crosstalk canceling unit 1023.

The nonlinear polarization crosstalk canceling unit 1023 cancels nonlinear polarization crosstalk included in the respective signals output from the carrier frequency error compensation-phase recovery unit 1022. Then, the nonlinear polarization crosstalk canceling unit 1023 outputs the respective signals from which the nonlinear polarization crosstalk has been canceled to the demodulating-decoding unit 1024. The demodulating-decoding unit 1024 carries out demodulation and decoding based on the respective signals output from the nonlinear polarization crosstalk canceling unit 1023. Then, the demodulating-decoding unit 1024 outputs data obtained by the demodulation and the decoding.

For example, signals received by the digital coherent receiver 1000 are signals resulting from mixing of plural polarized waves and are signals that involve deterioration due to characteristics of the transmission path. In order to compensate for this, the AEQ 80 executes equalization processing of splitting received signals into signal components of each polarized wave and estimating the transmission path characteristics to calculate inverse characteristics and recovering the transmitted data by multiplying the received signals by the inverse characteristics as the tap coefficients of the filter.

The equalization processing by the AEQ 80 is substantially constant power control and therefore the ALC unit 800 carries out the amplitude adjustment in order to set the center of the constellation to the target amplitude. If appropriate amplitude adjustment is not carried out in the ALC unit 800, a calculation error or a clip in amplitude determination processing in a block at a subsequent stage of the ALC unit 800 occurs, so that the signal quality deteriorates. In contrast, amplitude adjustment with a small error may be carried out by the ALC unit 800 in the digital coherent receiver 1000 according to the embodiment. Thus, improvement in the signal quality (for example, error rate) may be intended.

(Improvement in Q-factor by Amplitude Adjustment Circuit According to Embodiment)

Figure 11:
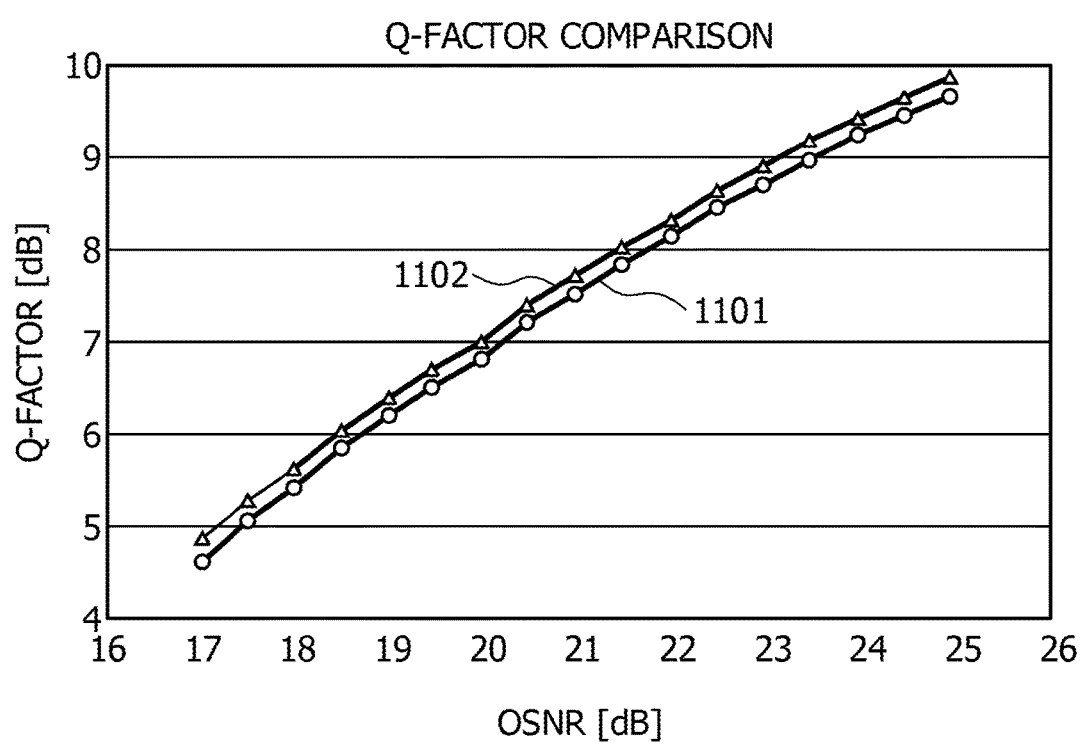
FIG. 11 is a diagram (first diagram) illustrating one example of improvement in a quality factor (Q-factor) by an amplitude adjustment circuit according to the embodiment.
Figure 12:
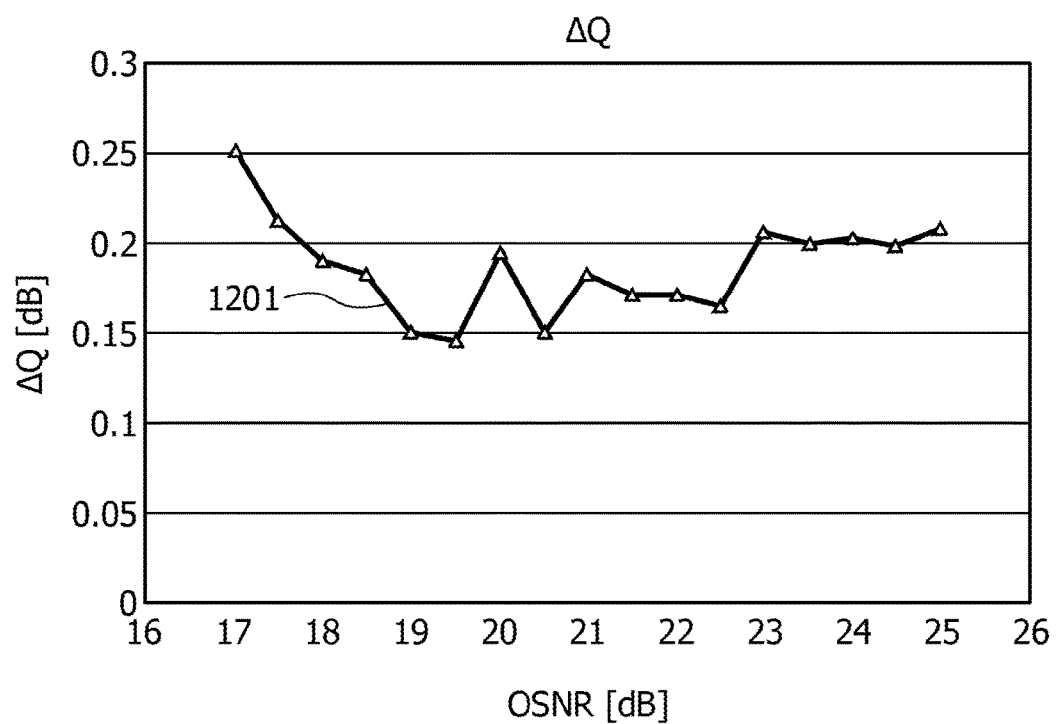
FIG. 12 is a diagram (second diagram) illustrating one example of improvement in a Q-factor by an amplitude adjustment circuit according to the embodiment.

FIG. 11 and FIG. 12 are diagrams illustrating one example of improvement in a Q-factor by an amplitude adjustment circuit according to the embodiment. In FIG. 11, the abscissa axis represents the OSNR [dB] and the ordinate axis represents the Q-factor [dB]. An OSNR_Q-factor characteristic 1101 in FIG. 11 represents, as reference, the Q-factor with respect to the OSNR when it is assumed that the gain adjustment coefficient is selected based on the peak value of the frequency distribution of the amplitude. An OSNR_Q-factor characteristic 1102 in FIG. 11 represents the Q-factor with respect to the OSNR when the gain adjustment coefficient is selected based on comparison between the frequency distribution of the amplitude and the frequency distributions of the correspondence table as in the amplitude adjustment circuit 100.

In FIG. 12, the abscissa axis represents the OSNR [dB] and the ordinate axis represents $\Delta Q$ [dB] as the difference in the Q-factor. An OSNR_$\Delta Q$ characteristic 1201 in FIG. 12 represents the difference between the OSNR_Q-factor characteristics 1101 and 1102 represented in FIG. 11. As represented in FIG. 11 and FIG. 12, the Q-factor is improved by selecting the gain adjustment coefficient based on comparison between the frequency distribution of the amplitude and the frequency distributions of the correspondence table as in the amplitude adjustment circuit 100. Due to this, improvement in the performance of reception by the digital coherent receiver 1000 may be intended, for example.

(Another Example of ALC Unit According to Embodiment)

Figure 13:
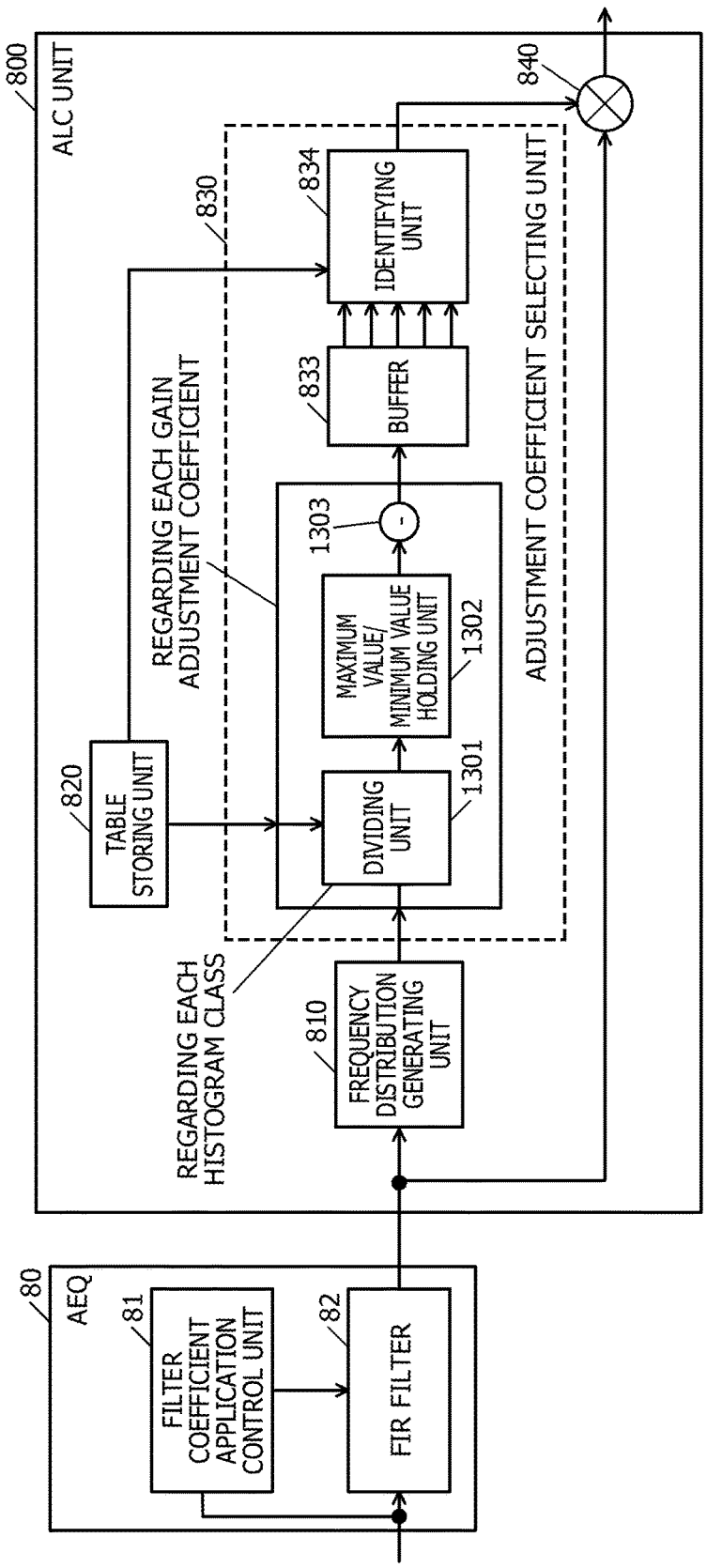
FIG. 13 is a diagram illustrating another example of an ALC unit according to the embodiment.

FIG. 13 is a diagram illustrating another example of an ALC unit according to the embodiment. In FIG. 13, a part similar to the part illustrated in FIG. 8 is given the same numeral and description thereof is omitted. The adjustment coefficient selecting unit 830 of the ALC unit 800 illustrated in FIG. 13 includes a dividing unit 1301, a maximum value/minimum value holding unit 1302, and a subtracting unit 1303 instead of the difference calculating unit 831 and the cumulative addition unit 832 illustrated in FIG. 8.

The dividing unit 1301 calculates the ratio between the frequency of the frequency distribution output from the frequency distribution generating unit 810 and the frequency of the frequency distribution included in the correspondence table stored in the table storing unit 820. The calculation of the ratio of the frequencies by the dividing unit 1301 is carried out regarding each of the histogram classes common to each frequency distribution. Furthermore, the calculation of the ratio regarding each histogram class is carried out regarding each of the frequency distributions included in the correspondence table stored in the table storing unit 820, for example, regarding each of the gain adjustment coefficients. The dividing unit 1301 outputs the ratio of each histogram class calculated regarding each gain adjustment coefficient to the maximum value/minimum value holding unit 1302.

The maximum value/minimum value holding unit 1302 holds the maximum value and the minimum value of the ratio of each histogram class output from the dividing unit 1301. This may calculate the maximum value and the minimum value of the ratio of the frequencies regarding each gain adjustment coefficient. The maximum value/minimum value holding unit 1302 outputs the maximum value and the minimum value of the ratio calculated regarding each gain adjustment coefficient to the subtracting unit 1303.

The subtracting unit 1303 calculates the difference between the maximum value and the minimum value (maximum value−minimum value) output regarding each gain adjustment coefficient from the maximum value/minimum value holding unit 1302. This may calculate the difference between the maximum value and the minimum value of the ratio regarding each gain adjustment coefficient. The subtracting unit 1303 stores the difference calculated regarding each gain adjustment coefficient in the buffer 833. The buffer 833 holds the difference of each gain adjustment coefficient stored by the subtracting unit 1303.

The identifying unit 834 identifies the smallest difference from the differences of the respective gain adjustment coefficients held by the buffer 833. Then, the identifying unit 834 acquires the gain adjustment coefficient corresponding to the identified difference from the table storing unit 820 and outputs the acquired gain adjustment coefficient to the gain adjusting unit 840.

In this manner, regarding each of the frequency distributions included in the correspondence table of the table storing unit 820, the adjustment coefficient selecting unit 830 illustrated in FIG. 13 calculates the difference between the maximum value and the minimum value of the ratio of the frequencies of each class with the frequency distribution generated by the frequency distribution generating unit 810. Then, the adjustment coefficient selecting unit 830 identifies the frequency distribution whose calculated difference is the smallest among the frequency distributions included in the correspondence table. This may identify the frequency distribution closest to the frequency distribution generated by the frequency distribution generating unit 810 among the frequency distributions included in the correspondence table.

(Another Example of Setting Processing of ALC Unit Based on Amplitude Adjustment Unit According to Embodiment)

Figure 14:
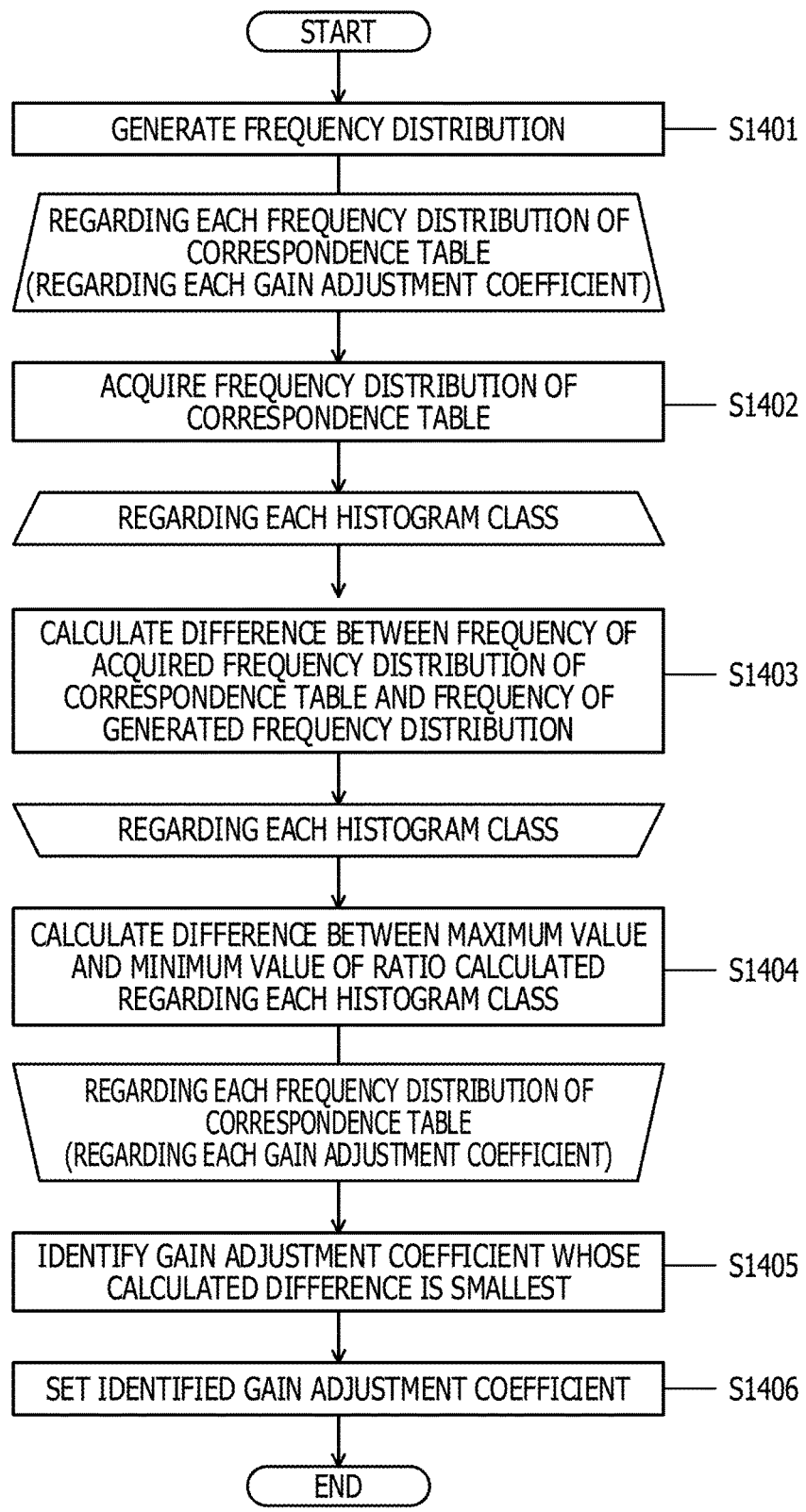
FIG. 14 is a flowchart illustrating another example of setting processing of an ALC unit based on an amplitude adjustment unit according to the embodiment.

FIG. 14 is a flowchart illustrating another example of setting processing of an ALC unit based on an amplitude adjustment unit according to the embodiment. The ALC unit 800 illustrated in FIG. 13 carries out the respective steps represented in FIG. 14, for example. Steps S1401 to S1406 represented in FIG. 14 are similar to the steps S901 to S906 represented in FIG. 9.

However, in the step S1403, the ALC unit 800 calculates the ratio between the frequency of the histogram class of the target in the frequency distribution of the correspondence table acquired in the step S1402 and the frequency of the histogram class of the target in the frequency distribution generated in the step S1401. The step S1403 is carried out by the dividing unit 1301 illustrated in FIG. 13, for example.

Furthermore, in the step S1404, the ALC unit 800 calculates the difference between the maximum value and the minimum value of the ratio calculated by the step S1403 regarding each histogram class. The step S1404 is carried out by the maximum value/minimum value holding unit 1302 and the subtracting unit 1303 illustrated in FIG. 13, for example. Moreover, the difference of each frequency distribution (for example, each gain adjustment coefficient) of the correspondence table calculated by the step S1404 is stored in the buffer 833 illustrated in FIG. 13, for example.

Furthermore, in the step S1405, the ALC unit 800 identifies the gain adjustment coefficient whose difference calculated regarding each frequency distribution (for example, each gain adjustment coefficient) of the correspondence table is the smallest. The step S1405 is carried out by the identifying unit 834 illustrated in FIG. 13, for example.

(Further Another Example of ALC Unit According to Embodiment)

Figure 15:
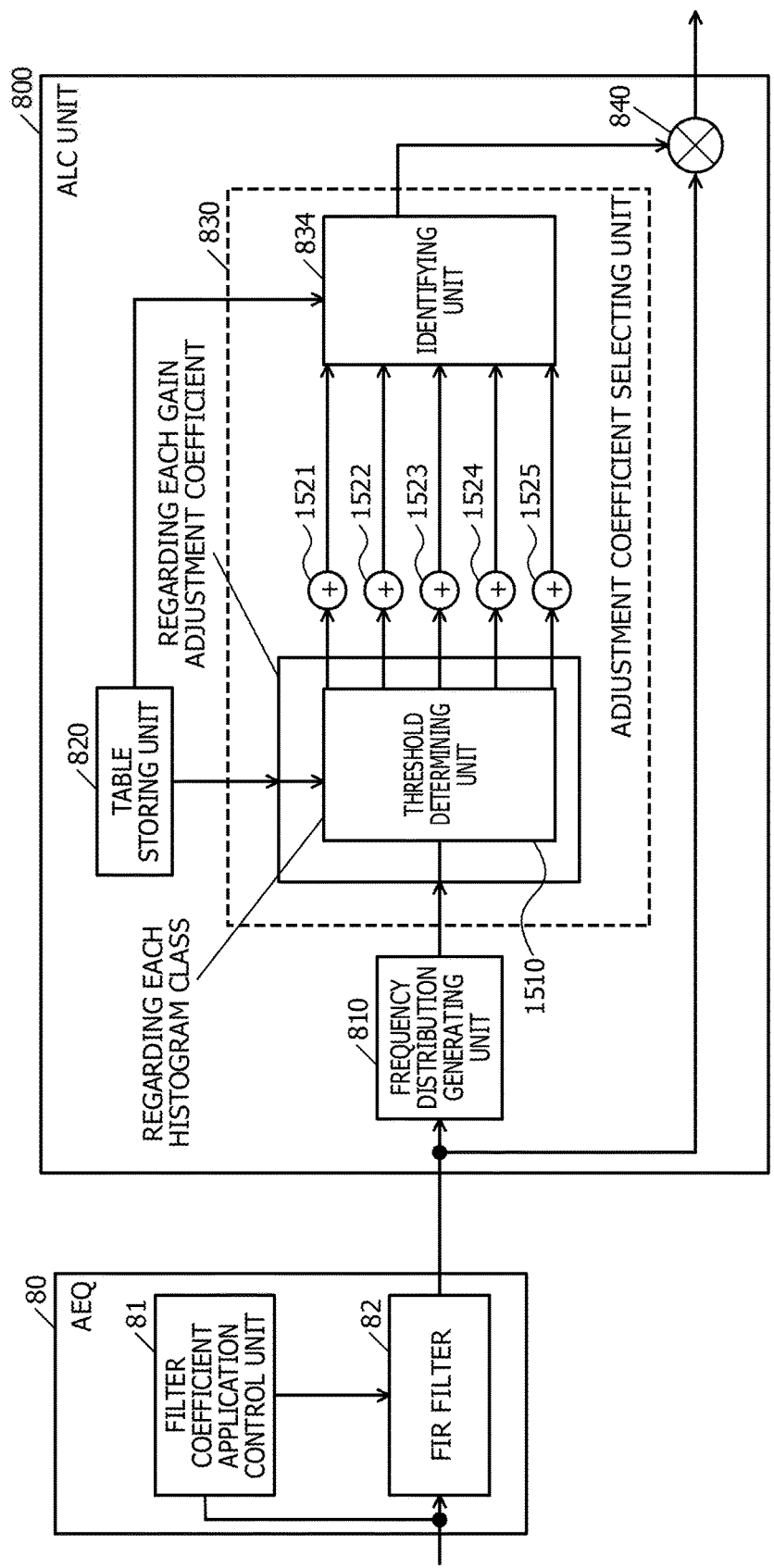
FIG. 15 is a diagram illustrating further another example of an ALC unit according to the embodiment.

FIG. 15 is a diagram illustrating further another example of an ALC unit according to the embodiment. In FIG. 15, a part similar to the part illustrated in FIG. 8 is given the same numeral and description thereof is omitted. The adjustment coefficient selecting unit 830 of the ALC unit 800 illustrated in FIG. 15 includes a threshold determining unit 1510 and counting units 1521 to 1525 instead of the difference calculating unit 831, the cumulative addition unit 832, and the buffer 833 illustrated in FIG. 8.

The table storing unit 820 illustrated in FIG. 15 stores a zone correspondence table (for example, see FIG. 16) in which frequency range distributions that represent frequency ranges (zones) corresponding to a respective one of histogram classes and gain adjustment coefficients are associated instead of the correspondence table 700 illustrated in FIG. 7.

The threshold determining unit 1510 determines which zone of the zone correspondence table stored in the table storing unit 820 the frequency of the frequency distribution output from the frequency distribution generating unit 810 is included. The determination by the threshold determining unit 1510 is carried out regarding each of the histogram classes common to each frequency distribution. Furthermore, the determination regarding each histogram class is carried out regarding each of the zones included in the zone correspondence table stored in the table storing unit 820, for example, regarding each of the gain adjustment coefficients. The threshold determining unit 1510 outputs the determination result of each gain adjustment coefficient to a respective one of the counting units 1521 to 1525. The determination result of each gain adjustment coefficient is information that represents whether or not the frequency is included in the zone (1 or 0) on a zone-by-zone basis, for example.

The counting units 1521 to 1525 are each a counting unit corresponding to a respective one of the zones (respective one of the gain adjustment coefficients) of the zone correspondence table. The counting unit 1521 sums the zone-by-zone determination results that are output from the threshold determining unit 1510 and correspond to the first zone (gain adjustment coefficient). For example, the counting unit 1521 counts the frequencies included in the first zone of the zone correspondence table.

Similarly, the counting units 1522 to 1525 sum the zone-by-zone determination results that are output from the threshold determining unit 1510 and correspond to the second to fifth zones (gain adjustment coefficients), individually. For example, the counting units 1522 to 1525 count the frequencies included in the second to fifth zones of the zone correspondence table.

The counting units 1521 to 1525 output the respective count values to the identifying unit 834. The identifying unit 834 identifies the largest count value from the respective count values output from the counting units 1521 to 1525. Then, the identifying unit 834 acquires the gain adjustment coefficient corresponding to the identified count value from the table storing unit 820 and outputs the acquired gain adjustment coefficient to the gain adjusting unit 840. For example, if the count value output from the counting unit 1521 is the largest, the identifying unit 834 acquires the first gain adjustment coefficient of the zone correspondence table from the table storing unit 820 and outputs the first gain adjustment coefficient to the gain adjusting unit 840.

In this manner, regarding each of the frequency range distributions included in the zone correspondence table of the table storing unit 820, the adjustment coefficient selecting unit 830 illustrated in FIG. 15 calculates the number of times of matching regarding each class with the frequency distribution generated by the frequency distribution generating unit 810. Then, the adjustment coefficient selecting unit 830 identifies the frequency range distribution regarding which the calculated number of times of matching is the largest among the frequency range distributions included in the zone correspondence table. This may identify the frequency range distribution closest to the frequency distribution generated by the frequency distribution generating unit 810 among the frequency range distributions included in the zone correspondence table. Furthermore, processing that involves expansion of the circuit scale, such as division, does not need to be executed and therefore increase in the circuit scale may be suppressed.

(Zone Correspondence Table Used by Amplitude Adjustment Circuit According to Embodiment)

FIG. 16 is a diagram illustrating one example of a zone correspondence table used by an amplitude adjustment circuit according to the embodiment. The table storing unit 820 illustrated in FIG. 15 stores a zone correspondence table 1600 illustrated in FIG. 16, for example. The zone correspondence table 1600 may be generated from the correspondence table 700 illustrated in FIG. 7, for example.

For example, the zone correspondence table 1600 may be obtained by calculating the differences between adjacent rows among the respective rows in the correspondence table 700 illustrated in FIG. 7. For example, at histogram class=0 of the correspondence table 700, the cumulative value of coefficient=115 is 358 and the cumulative value of coefficient=113 is 250. Thus, the threshold between coefficient=115 and coefficient=113 is set to (358+250)/2=304. By executing this processing at all classes, thresholds #1 between coefficient=115 and coefficient=113 are obtained. Similarly, thresholds #2 between coefficient=113 and coefficient=111, thresholds #3 between coefficient=111 and coefficient=109, and thresholds #4 between coefficient=109 and coefficient=107 are decided.

The coefficient-115 zone is a zone of actual measurement value≥threshold #1. The coefficient-113 zone is a zone of threshold #1>actual measurement value≥threshold #2. The coefficient-111 zone is a zone of threshold #2>actual measurement value≥threshold #3. The coefficient-109 zone is a zone of threshold #3>actual measurement value≥threshold #4. The coefficient-107 zone is a zone of threshold #4>actual measurement value.

(Further Another Example of Setting Processing of ALC Unit Based on Amplitude Adjustment Unit According to Embodiment)

Figure 17:
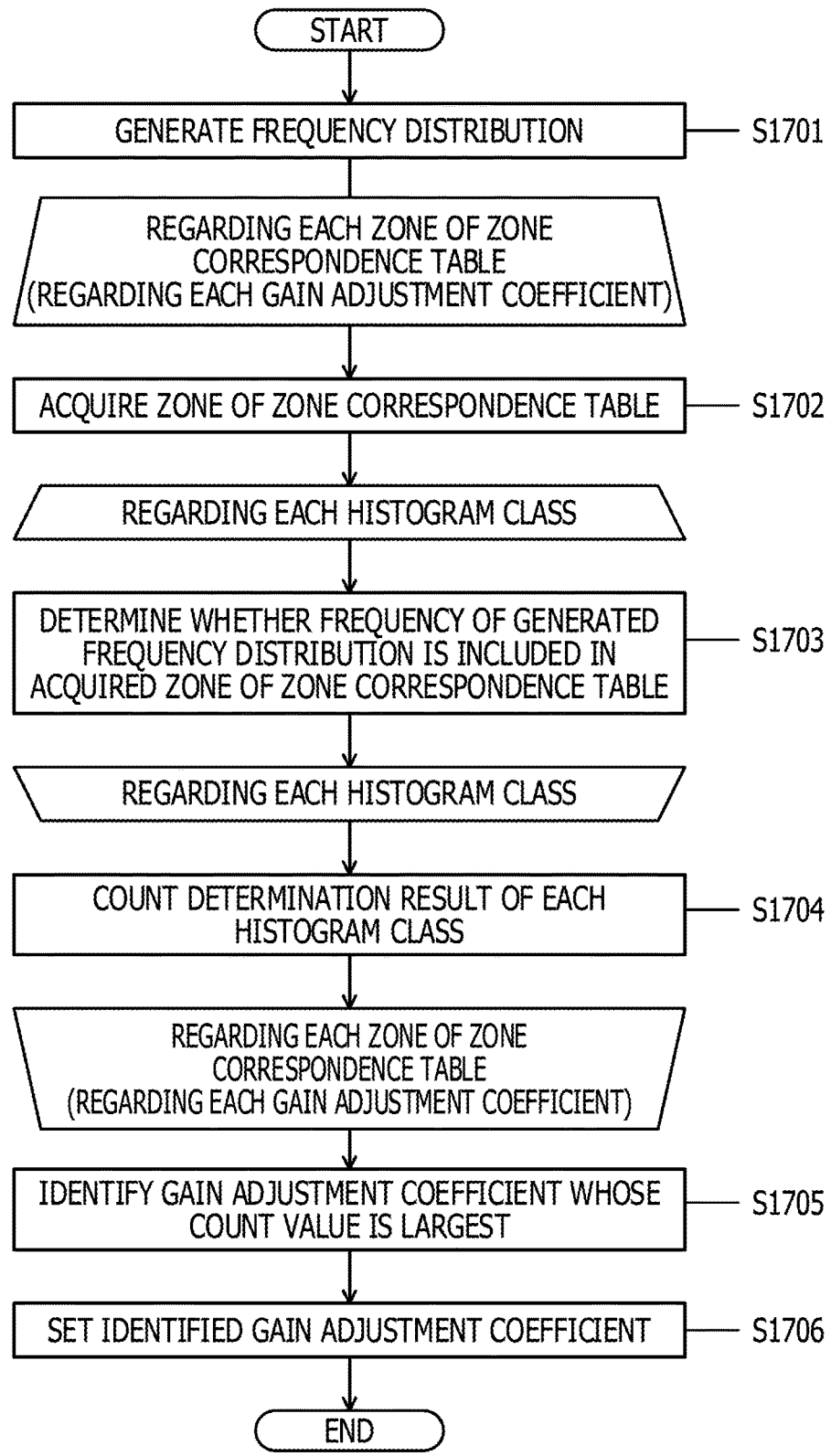
FIG. 17 is a flowchart illustrating further another example of setting processing of an ALC unit based on an amplitude adjustment unit according to the embodiment.

FIG. 17 is a flowchart illustrating further another example of setting processing of an ALC unit based on an amplitude adjustment unit according to the embodiment. The ALC unit 800 illustrated in FIG. 15 carries out the respective steps represented in FIG. 17, for example. A step S1701 represented in FIG. 17 is similar to the step S901 represented in FIG. 9.

Subsequent to the step S1701, the ALC unit 800 carries out the steps S1702 to S1704 regarding each zone of the zone correspondence table stored in the table storing unit 820 (for example, regarding each gain adjustment coefficient). For example, the ALC unit 800 acquires the zone of the target in the zone correspondence table (step S1702). The step S1702 is carried out by the threshold determining unit 1510 illustrated in FIG. 15, for example.

Next, the ALC unit 800 carries out the step S1703 regarding each histogram class. For example, the ALC unit 800 determines whether or not the frequency of the histogram class of the target in the frequency distribution generated by the step S1701 is included in the zone of the zone correspondence table acquired by the step S1702 (step S1703). The step S1703 is carried out by the threshold determining unit 1510 illustrated in FIG. 15, for example.

Next, the ALC unit 800 counts (sums) the determination result of the step S1703 regarding each histogram class (step S1704). The step S1704 is carried out by the counting units 1521 to 1525 illustrated in FIG. 15, for example.

Next, the ALC unit 800 identifies the gain adjustment coefficient regarding which the count value of the zone (for example, gain adjustment coefficient) of the zone correspondence table is the largest (step S1705). The step S1705 is carried out by the identifying unit 834 illustrated in FIG. 15, for example. A step S1706 represented in FIG. 17 is similar to the step S906 represented in FIG. 9.

As above, according to the amplitude adjustment circuit 100 in accordance with the embodiment, the adjustment coefficient of the gain may be selected based on the result of comparison between the frequency distributions included in the correspondence information between the frequency distributions of the amplitude and the adjustment coefficients and the frequency distribution of the amplitude of signals of the processing target. Due to this, an appropriate adjustment coefficient according to noise in the signals of the processing target is selected. Thus, the adjustment error of the amplitude may be made small and reduction in the error rate may be intended.

The configuration in which the digital coherent receiver to which the amplitude adjustment circuit 100 is applied receives optical signals of the 16 QAM is described. However, the configuration is not limited to such a configuration. For example, a configuration may be employed in which the digital coherent receiver to which the amplitude adjustment circuit 100 is applied receives optical signals of 4 QAM, 8 QAM, 32 QAM, 64 QAM, or the like.

As described above, according to the amplitude adjustment circuit, the digital coherent receiver, and the amplitude adjustment method, the adjustment error of the amplitude may be made small and reduction in the error rate may be intended.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An amplitude adjustment circuit comprising:
   a memory that stores correspondence information between frequency distributions of an amplitude and adjustment coefficients; and
   a processor configured to:
   generate a frequency distribution of amplitude of data, for which adaptive equalization processing has been executed by an adaptive equalization circuit, by a generating circuit;
   acquire the correspondence information between frequency distributions of the amplitude and adjustment coefficients from the memory;
   select the adjustment coefficient based on a result of comparison between the frequency distributions included in the correspondence information acquired by an acquiring circuit and the frequency distribution; and
   adjust a gain of the data based on the adjustment coefficient selected by a selecting circuit.

2. The amplitude adjustment circuit according to claim 1, wherein the processor further configured to identify the frequency distribution closest to the frequency distribution generated by the generating circuit among the frequency distributions included in the correspondence information by carrying out comparison of a frequency of each class with the frequency distribution generated by the generating circuit regarding each of the frequency distributions included in the correspondence information, and selects the adjustment coefficient based on the frequency distribution that is identified and the correspondence information.

3. The amplitude adjustment circuit according to claim 2, wherein the processor configured to calculate a total of difference in the frequency of each class from the frequency distribution generated by the generating circuit regarding each of the frequency distributions included in the correspondence information, and identifies the frequency distribution regarding which the total of difference that is calculated is smallest among the frequency distributions included in the correspondence information, and selects the adjustment coefficient based on the frequency distribution that is identified and the correspondence information.

4. The amplitude adjustment circuit according to claim 2, wherein the processor configured to calculate difference between a maximum value and a minimum value of a ratio of the frequencies of each class with the frequency distribution generated by the generating circuit regarding each of the frequency distributions included in the correspondence information, and identifies the frequency distribution regarding which the difference that is calculated is smallest among the frequency distributions included in the correspondence information, and selects the adjustment coefficient based on the frequency distribution that is identified and the correspondence information.

5. The amplitude adjustment circuit according to claim 1, wherein
   the correspondence information is correspondence information between frequency range distributions that represent frequency ranges regarding a respective one of classes of the amplitude and the adjustment coefficients, and
   the processor configured to calculate a number of times of matching of each class with the frequency distribution generated by the generating circuit regarding each of the frequency range distributions included in the correspondence information, and identifies the frequency range distribution regarding which the number of times of matching that is calculated is largest among the frequency range distributions included in the correspondence information, and selects the adjustment coefficient based on the frequency range distribution that is identified and the correspondence information.

6. The amplitude adjustment circuit according to claim 1, wherein the processor further configured to adjust the gain of the data by multiplying the data by the adjustment coefficient selected by the selecting circuit.

7. A digital coherent receiver comprising:

an adaptive equalization circuit that executes adaptive equalization processing of digital data obtained by coherent reception of an optical signal; and an amplitude adjustment circuit that generates a frequency distribution of amplitude of the digital data for which the adaptive equalization processing has been executed by the adaptive equalization circuit and adjusts a gain of the digital data based on an adjustment coefficient selected based on a result of comparison between frequency distributions of the amplitude included in correspondence information between the frequency distributions and the adjustment coefficients and the frequency distribution that is generated.

8. The digital coherent receiver according to claim 7, wherein the optical signal is an optical signal of a modulation system in which symbols having different amplitudes exist in a mixed manner.

9. The digital coherent receiver according to claim 8, wherein the modulation system is a quadrature amplitude modulation system.

10. An amplitude adjustment method, comprising causing a processor to execute the operation of:

generating a frequency distribution of amplitude of data for which adaptive equalization processing has been executed;

acquiring correspondence information between frequency distributions of the amplitude and adjustment coefficients;

selecting the adjustment coefficient based on a result of comparison between the frequency distributions included in the correspondence information that is acquired and the frequency distribution that is generated; and adjusting a gain of the data based on the adjustment coefficient that is selected.

* * * * *